United States Patent [19]

Huntington et al.

[11] 3,729,694

[45] Apr. 24, 1973

[54] STRIP TRANSMISSION LINE BROADBAND 4:1 IMPEDANCE TRANSFORMER

[75] Inventors: Robert C. Huntington, Phoenix; Lewis Wood, Scottsdale, both of Ariz.

[73] Assignee: Motorola, Inc., Franklin Park, Ill.

[22] Filed: Sept. 28, 1971

[21] Appl. No.: 184,418

[52] U.S. Cl. ....................333/33, 333/84 M, 333/35

[51] Int. Cl. ....................H03h 7/38

[58] Field of Search ....................333/84 M, 32, 33, 333/35

[56] References Cited

UNITED STATES PATENTS

| | | | |
|---|---|---|---|
| 2,790,148 | 4/1957 | Kostriza | 333/33 X |
| 2,611,822 | 9/1952 | Bliss | 333/32 |
| 3,573,670 | 4/1971 | Skobern | 333/84 M |

FOREIGN PATENTS OR APPLICATIONS

| | | | |
|---|---|---|---|
| 761,781 | 11/1956 | Great Britain | 333/32 |

OTHER PUBLICATIONS

IBM Technical Disclosure Bulletin "Superconductive Transformer" by Anderson et al., Vol. 4 No. 7, Dec., 1961.

*Primary Examiner*—Rudolph V. Rolinec
*Assistant Examiner*—Saxfield Chatmon, Jr.
*Attorney*—Vincent Rauner et al.

[57] ABSTRACT

An electrical transformer for transforming electrical impedances in a four-to-one ratio includes a dielectric substrate having U-shaped metallized conductors deposited on opposite surfaces of the substrate, the two U-shaped conductors being substantially superimposed on each other, and having one end of one of the conductors connected to the nearest end of the other conductor through a hole in the substrate. The transformer provides a four-to-one impedance transformation between an input port including the first and second ends of one of the U-shaped strips and another port including the unconnected ends of the two strips.

9 Claims, 3 Drawing Figures

STRIP TRANSMISSION LINE BROADBAND 4:1 IMPEDANCE TRANSFORMER

BACKGROUND

This invention relates generally to transformers, and more particularly to radio frequency transformers employing strip transmission lines.

There are many applications wherein it is desired to transform electrical impedances from one level to another. One such application is between amplifier stages of a transistorized radio frequency transmitter. In this application, the output impedance of a transistor amplifier must be matched to the input impedance of a succeeding transistor amplifier to provide power transfer between stages.

Several techniques for providing impedance transformation between radio frequency amplifier stages are known. These techniques include systems utilizing tuned transformers and toroidal ferrite transformers.

Whereas these techniques provide a way to match the output impedance of a radio frequency amplifier to the input impedance of another radio frequency amplifier, the first technique is a narrow band technique which requires tuning to the frequency of operation of the radio frequency amplifier and is inoperable in wide band amplifiers. The toroidal ferrite transformer used in the second technique is expensive to manufacture and becomes inefficient at high frequencies.

SUMMARY

It is an object of the present invention to provide an improved radio frequency transformer for transforming impedances from one level to another.

It is a further object of this invention to provide a wide band transformer for matching the output impedance of a transistorized radio frequency amplifier to the input impedance of a succeeding amplifier.

It is another object of this invention to provide a wide band transformer using strip transmission line techniques.

A still further object of this invention is to provide a transformer that can be uniformly manufactured at low cost using hybrid circuit techniques.

Yet another object of this invention is to provide a transformer that is fabricated entirely from inorganic materials.

Still another object of the invention is to provide a transformer that is compact in size and can be used with miniaturized semiconductor circuits.

In accordance with one embodiment of the invention, a sheet of dielectric material has a U-shaped metallic conductor deposited on each of its major surfaces. The two U-shaped metallic conductors are substantially superimposed on each other to provide electromagnetic coupling therebetween. The dielectric substrate has a hole near one end of the U-shaped conductors through which an electrical connection is made between one end of each of the conductors.

The two ends of one of the U-shaped conductors serve as one port of the transformer, while the ends of the conductors that are not connected to each other serve as the other port. One of the unconnected ends of one of the conductive strips can be connected to a reference potential. With respect to this reference, the common point between the two strips is the low impedance terminal, and the remaining free end is the high impedance terminal. In the disclosed embodiment, the impedance transformation ratio between the ports is four-to-one.

DETAILED DESCRIPTION

Figure 1:
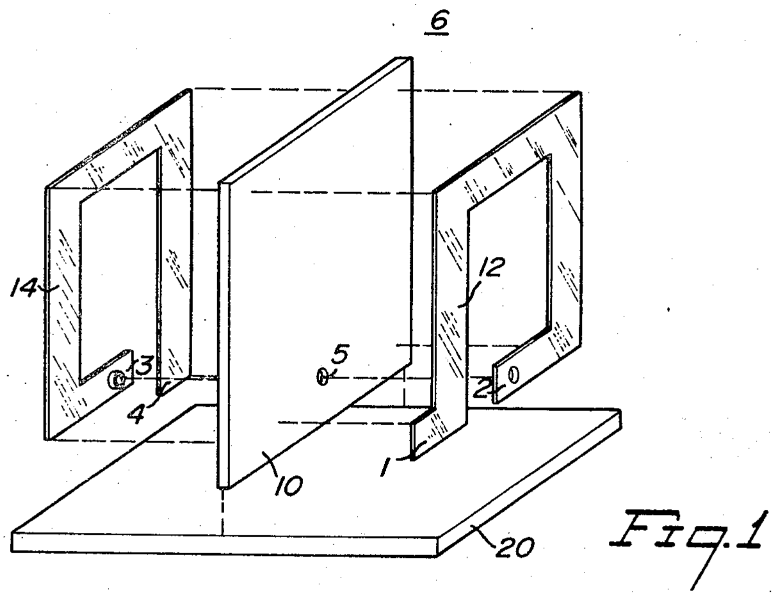
FIG. 1 is a diagram of the transformer according to the invention.

Referring now to the drawing in greater detail, FIG. 1 shows one embodiment of a strip transmission line matching network or transformer 6 according to the invention. Although vertical mounting of transformer 6 is shown, the transformer may be mounted in any plane. A substrate 10 made of a dielectric material has one of two U-shaped strips 12 and 14 deposited on each of its surfaces. The strips need not be U-shaped, but box-shaped, circular, meandering and other geometries can be used. The two strips are substantially superimposed on each other to provide electromagnetic coupling therebetween to form a balanced transmission line. The length of the transmission line thus formed is not critical, but should be at about 0.1 wavelength, and preferably less than 0.25 wavelength. The wavelengths referred to are the wavelengths occurring in the strip line, not in free space, at the mid-band frequency of the transformer. Mid-band refers to the middle of the operating band of frequencies of the transformer. It should be noted that the length of the transmission line is given in mid-band wavelengths, and that the numbers will be considerably different when referred to frequencies at the extreme ends of the operating range of the transformer. An end 3 of strip 14 overlaps an end 2 of strip 12. A hole 5 in substrate 10, through which a conductive material is deposited between ends 2 and 3, provides an electrical interconnection between strips 12 and 14. Although a hole is used to provide an interconnection between the strips in this embodiment, any minimum length connection such as a hole, a strap around an edge of the substrate or other suitable connection may be used. A metallic ground plane 20 is attached to substrate 10, and end 4 of strip 14 is connected thereto. The unconnected end 1 of strip 12 provides a high impedance terminal for transformer 6, while the junction of strips 12 and 14 at hole 5 provides a low impedance terminal. The transformer provides a four-to-one impedance transformation ratio between its high and low impedance ports. The high impedance port is between end 1 and ground 20, and the low impedance port is between the junction 20 of ends 3 and 4 and ground 20.

It is possible to fabricate the transformer of FIG. 1 entirely from inorganic materials such as, for example, ceramic for the substrate and copper for the conductors, using hybrid circuit techniques employed in the semiconductor art. This allows the transformer to be operated at high power and at high ambient temperatures without damage. In addition, the unit may be hermetically sealed, if desired, because the materials used do not emit gasses when placed in a vacuum.

Figure 2:
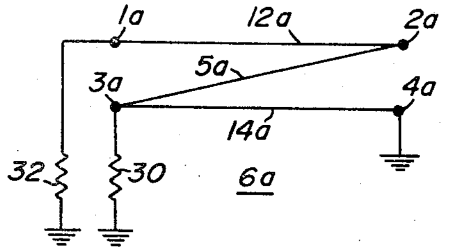
FIG. 2 is a schematic diagram of a balanced transmission line used as an impedance transformer.
Figure 3:
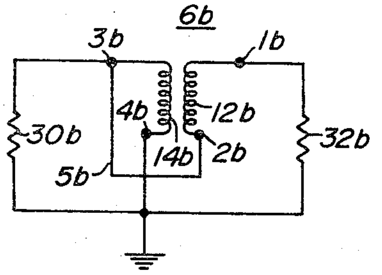
FIG. 3 is a transformer equivalent circuit of the balanced transmission line transformer of FIG. 2.

In order to better explain the operation of the transformer of FIG. 1, the schematic diagrams of FIGS. 2 and 3 will be used. Referring to FIG. 2, which shows a balanced transmission line transformer 6*a*, line 12*a* corresponds to strip 12 of FIG. 1, and line 14*a* corresponds to strip 14 of FIG. 1. Points 1*a*, 2*a*, 3*a*, 4*a*, and 5*a* correspond to points 1, 2, 3, 4 and 5, respectively. Terminals 2*a* and 3*a* are connected to each other via lead 5*a*. Terminal 4*a* is connected to ground, and terminals 1*a* and 3*a* are each connected to an end of impedance 32 and 30, respectively. The other ends of impedances 32 and 30 are connected to ground. Transmission line transformer 6a acts as a four-to-one impedance transformer to match impedance 32 to impedance 30. The length of the line in transformer 6*a* should be generally 0.1 wavelength long at mid-band. The characteristic impedance of the transmission line of transformer 6*a* is preferably equal to the geometric mean of impedances 32 and 30, wherein the geometric mean of impedances 32 and 30 is defined as the square root of the product of the values of impedances 32 and 30. Whereas the characteristic impedance of the line is preferably the geometric mean of the impedances 32 and 30, this impedance is not critical, and transformers may be constructed using other values of characteristic impedance if desired for size reduction, or for other reasons.

FIG. 3 shows a transformer equivalent circuit of the transmission line transformer of FIG. 2 and is shown to more fully explain the operation of the transmission line of FIG. 2. Points denoted by the same number but having different suffixes have analogous functions. Coil 14*b* is analogous to line 14*a* and coil 12*b* is analogous to line 12*a*. Coils 14*b* and 12*b* are coupled to each other inductively and have ends 3*b* and 2*b* connected to each other electrically via lead 5*b*. The coils 14*b* and 12*b*, when connected in this fashion, form an auto-transformer. Since, in this instance, lines 12*a* and 14*a* of FIG. 2 are two lines of a balanced transmission line, they have equal length and, accordingly, analogous coils 12*b* and 14*b* have an equal number of turns. Coils 12*b* and 14*b* are in series electrically providing twice as many turns between point 1*b* and ground through coils 12*b* and 14*b* as there are between point 3*b* and ground through coil 14*b*. The impedance transformation ratio of a transformer is equal to the square of the turns ratio, making the impedance between point 1*b* and ground equal to four times the impedance between point 3*b* and ground. Therefore, transformer 6*b* can be used as a matching transformer between impedances having a four-to-one impedance ratio.

As stated before, the characteristic impedance of the transmission lines used in FIG. 6 is preferably equal to the geometric mean of the input and output impedances attached thereto. The characteristic impedance of a strip transmission line can be adjusted to this or another desired value by adjusting the width of the strips employed, the thickness of the dielectric and the dielectric constant of the dielectric. These techniques are well known in the art and a line having the desired characteristic impedance can be readily fabricated.

The transformer of the present invention provides a flexible way to achieve wide band impedance and voltage transformation without the use of toroidal transformers. Transformers according to the present invention can be manufactured with a much greater degree of uniformity than can presently be achieved for toroidal transformers. The transformer operates over a wide band of frequencies and provides electrical characteristics similar to those of a toroidal transformer. The transformer can be tailored to operate over a wide range of impedances, and several transformers can be cascaded to provide a greater transformation ratio than four-to-one. One embodiment of the transformer has been shown wherein the lengths of lines on each side of the substrate are equal and wherein the lines are electrically connected to each other. However, other configurations using unequal length lines and lines without an electrical connection between them may be used to provide isolation and other impedance transformation ratios and still fall within the scope of the invention.

We claim:

1. An electrical transformer including in combination, a layer of dielectric material having two opposing surfaces, a first electrically conductive elongated strip bonded to one of said surfaces, a second electrically conductive elongated strip bonded to the other of said surfaces, each of said elongated strips having two ends with one of said ends of said first strip connected to one of said ends of said second strip, said strips being substantially parallel to each other with effective lengths which are substantially equal and between approximately 0.1 and 0.25 wave lengths at mid-band frequencies, said strips being electromagnetically coupled to each other whereby one of said strips develops an alternating current voltage thereacross in response to an alternating current voltage applied to the other of said strips.

2. An electrical transformer as recited in claim 1 wherein each of said strips forms a U-shaped structure, said structures being substantially superimposed on each other.

3. An electrical transformer including in combination, a layer of dielectric material having two opposing surfaces, a first electrically conductive elongated strip bonded to one of the said surfaces, a second electrically conductive elongated strip bonded to the other of said surfaces each of said strips forming a U-shaped structure, said structures being substantially superimposed on each other, each of said strips having two ends with one of said ends of said first strip connected to one of said ends of said second strip, said strips being substantially parallel to each other with effective lengths which are substantially equal, said strips being electromagnetically coupled to each other whereby one of said strips develops an alternating current voltage thereacross in response to an alternating current voltage applied to the other of said strips, the transformer having first and second ports, said transformer providing an impedance transformation between said ports, said first port being between the ends of said first strip and said second port being between the unconnected ends of said first and second strips.

4. An electrical transformer as recited in claim 3 wherein said impedance transformation has a four-to-one ratio.

5. An electrical transformer as recited in claim 3 wherein said dielectric layer has a hole therethrough, and wherein said ends of said strips are connected through said hole.

6. A transmission line matching network including in combination, a layer of dielectric material having two opposing surfaces, a first electrically conductive elongated strip bonded to one of said surfaces, a second electrically conductive elongated strip bonded to the other of said surfaces, said strips being electromagnetically coupled to each other to form a balanced transmission line, each of said elongated strips having two ends wherein one of said ends of said first strip is connected to one of said ends of said second strip, said matching network providing an impedance transformation between first and second ports, said first port being between the ends of said first strip and said second port being between said unconnected ends of said first and second strips.

7. A transmission line matching network as recited in claim 6 wherein said impedance transformation has a four-to-one ratio.

8. A transmission line matching network as recited in claim 7 for matching a first impedance to a second impedance, said first impedance being connected to said first port and said second impedance being connected to said second port, said transmission line matching network having a characteristic impedance equal to the geometric mean of said first and second impedances.

9. A transmission line matching network as recited in claim 8 wherein the length of said transmission line is between approximately 0.1 and 0.25 wavelengths at mid-band frequencies.

* * * * *